(12) United States Patent
Fujita et al.

(10) Patent No.: US 11,206,029 B2
(45) Date of Patent: Dec. 21, 2021

(54) PLL CIRCUIT

(71) Applicant: THINE ELECTRONICS, INC., Tokyo (JP)

(72) Inventors: Yusuke Fujita, Tokyo (JP); Yuji Gendai, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/591,679

(22) Filed: Oct. 3, 2019

(65) Prior Publication Data

US 2020/0112316 A1 Apr. 9, 2020

(30) Foreign Application Priority Data

Oct. 4, 2018 (JP) .............................. JP2018-189013

(51) Int. Cl.
*H03L 7/099* (2006.01)
*H03L 7/18* (2006.01)
*H03L 7/089* (2006.01)

(52) U.S. Cl.
CPC .......... *H03L 7/0995* (2013.01); *H03L 7/0895* (2013.01); *H03L 7/18* (2013.01)

(58) Field of Classification Search
CPC ....... H03L 7/085; H03L 7/087; H03L 7/0891; H03L 7/0895; H03L 7/0896; H03L 7/093; H03L 7/095; H03L 7/099; H03L 7/0995; H03L 7/18; H03L 2207/50; H04L 7/033; H04L 7/0337

See application file for complete search history.

(56) References Cited

U.S. PATENT DOCUMENTS

| 7,102,446 B1 | 9/2006 | Lee et al. |
| 2008/0238495 A1* | 10/2008 | Tachibana ................. H03L 7/18 327/105 |
| 2010/0265001 A1* | 10/2010 | Tsuda ........................ H03L 7/10 331/36 C |

FOREIGN PATENT DOCUMENTS

JP 2003-78410 A 3/2003

* cited by examiner

*Primary Examiner* — Long Nguyen
(74) *Attorney, Agent, or Firm* — Sughrue Mion, PLLC (57) ABSTRACT

A PLL circuit includes a phase comparator, a charge pump, a loop filter, a voltage-controlled oscillator, a frequency divider, a frequency difference determination unit, and an FV characteristics adjustment unit. The frequency difference determination unit determines whether or not a frequency difference between a feedback oscillation signal and an input signal is equal to or smaller than a threshold value. The FV characteristics adjustment unit selects a frequency band in the voltage-controlled oscillator and adjusts FV characteristics.

2 Claims, 7 Drawing Sheets

PLL CIRCUIT

TECHNICAL FIELD

The present invention relates to a PLL circuit.

BACKGROUND

In general, a phase locked loop (PLL) circuit includes a phase comparator, a charge pump, a loop filter, and a voltage-controlled oscillator (VCO), which constitute a loop. The PLL circuit is used as a frequency synthesizer that outputs an oscillation signal having a frequency obtained by multiplying a frequency of an input oscillation signal by a constant. Further, the PLL circuit can recover a clock signal embedded in a digital signal that is input in a clock data recovery (CDR) device.

The PLL circuit operates as follows. When a control voltage value is input to the voltage-controlled oscillator, an oscillation signal having a frequency according to the control voltage value is output from the voltage-controlled oscillator. The oscillation signal output from the voltage-controlled oscillator or a signal obtained by frequency-dividing this oscillation signal is input to the phase comparator as a feedback oscillation signal. Further, another input signal (an oscillation signal or a digital signal) is also input to the phase comparator, in addition to this feedback oscillation signal. In the phase comparator, a phase difference between the input signal and the feedback oscillation signal is detected, and a phase difference signal indicating the detected phase difference is output to the charge pump.

A charge and discharge current according to the phase difference indicated by the phase difference signal is output from the charge pump that receives the phase difference signal. This charge and discharge current is input to the loop filter. The loop filter includes a capacitive element of which a charge accumulation amount is increased or decreased according to the charge and discharge current output from the charge pump. The loop filter outputs a control voltage value according to the charge accumulation amount to the voltage-controlled oscillator. The control voltage value output from the loop filter is input to the voltage-controlled oscillator, and an oscillation signal having a frequency according to the control voltage value is output from the voltage-controlled oscillator.

In the PLL circuit having such a loop, the control voltage value output from the loop filter and input to the voltage-controlled oscillator converges to a certain value so that the phase difference detected by the phase comparator decreases. The oscillation signal having a frequency obtained by multiplying the frequency of the input oscillation signal by a constant is output from the voltage-controlled oscillator, or the clock signal embedded in the input digital signal is recovered and output.

There are various types of voltage-controlled oscillator. Among these, an LC-VCO includes an inductor and a capacitor, and outputs an oscillation signal having a frequency according to an input control voltage value due to a resonance phenomenon caused by the inductor and the capacitor. The LC-VCO has less jitter than other types of voltage-controlled oscillators. Therefore, use of the LC-VCO among various types of voltage-controlled oscillators is suitable in the case of a frequency of 10 Gbps or more.

The LC-VCO has a smaller change in a frequency of an output oscillation signal with respect to change in the control voltage value as compared with other types of voltage-controlled oscillators. In the LC-VCO, when a capacitance value of the capacitor is changed, FV characteristics between the frequency (F) of the output oscillation signal and the control voltage value (V) can be changed. Further, a range of the control voltage value to be input to the LC-VCO is limited, and when the control voltage value deviates from this range, a proportional relationship of a frequency between an input and an output is not established.

Incidentally, a frequency of a transmitted signal may fluctuate with time due to a spread spectrum (SS). When the frequency of the signal is constant, the energy of electromagnetic waves radiated from the signal is concentrated on the frequency. Accordingly, electromagnetic interference (EMI) becomes a problem. On the other hand, when the frequency of the signal is intentionally modulated by the SS, a frequency band of the energy of the electromagnetic waves radiated from the signal is widened and a peak is reduced. The problem of the EMI can be reduced by the SS. When a bit rate of the signal is high or when a transmission distance is long, it is preferable for the frequency of the signal to be modulated by the SS. In some cases, ±1.0% or more is required as a modulation degree of the frequency due to the SS.

For example, a serializer device that converts parallel data into serial data and outputs the serial data latches the parallel data at a timing indicated by a first clock signal having a low frequency, and outputs the serial data at a timing indicated by a second clock signal having a high frequency. In such a serializer device, the SS may be applied such that the serial data is output. In this case, a PLL circuit that is used in the serializer device receives a first clock signal with which the SS has been applied and generates and outputs the second clock signal that has a frequency that is a constant multiple of the frequency of the first clock signal and with which the SS has been applied.

When a bit rate of the serial data is high and the frequency of the second clock signal is high, it is preferable to use the LC-VCO as the voltage-controlled oscillator included in the PLL circuit, as described above. However, when modulation of the frequency by the SS in the first clock signal to be input to the PLL circuit is large, a situation in which a variation in a control voltage value to be input to the LC-VCO also increases and the frequency of the second clock signal output from the PLL circuit is not proportional to the frequency of the first clock signal occurs. In the LC-VCO, it is important for FV characteristics to be appropriately set by appropriately setting the capacitance value of the capacitor and selecting any one of a plurality of frequency bands in order to avoid such a situation.

Patent Documents 1 and 2 disclose inventions in which FV characteristics are intended to be appropriately set. In the embodiment disclosed in Patent Document 1, a capacitance value of a capacitor is set in an LC-VCO so that a frequency of a first clock signal and a frequency of a second clock signal are always proportional to each other in a range in which the frequency of the first clock signal varies. In the invention disclosed in Patent Document 2, the capacitance value of the capacitor is set in the LC-VCO so that a control voltage value input to the LC-VCO is always present within a predetermined range, in the range in which the frequency of the first clock signal varies.

PRIOR ART DOCUMENTS

Patent Documents

[Patent Document 1] Japanese Unexamined Patent Publication No. 2003-78410
[Patent Document 2] U.S. Pat. No. 7,102,446

SUMMARY

However, in the invention disclosed in Patent Document 1, even when FV characteristics of the LC-VCO are appropriate at the time of initial setting, the FV characteristics of the LC-VCO may deteriorate in a case in which a voltage or temperature varies. That is, the invention disclosed in Patent Document 1 may not be able to secure a sufficient voltage and temperature (VT) drift margin.

Further, in the invention disclosed in Patent Document 2, when a range in which the control voltage value input to the LC-VCO is monitored is wide, there is a problem that is the same as the above problem that the invention disclosed in Patent Document 1 has. On the other hand, when the range in which the control voltage value input to the LC-VCO is monitored is narrow and a frequency modulation by the SS is large and a variation width of the control voltage value is wide, the FV characteristics that the control voltage value is always present within a predetermined range cannot be found in some cases. Further, when the range in which the control voltage value input to the LC-VCO is monitored is narrow and the FV characteristics that the control voltage value is present within the predetermined range even a little are selected, the selected FV characteristics are not necessarily suitable. Such a problem occurs not only in an LC-VCO but also in a voltage-controlled oscillator including a ring oscillator in which a plurality of delay elements having a delay set on the basis of an input control voltage value are connected in a ring shape.

The present invention has been made to solve the above problems, and an object of the present invention is to provide a PLL circuit capable of more suitably setting FV characteristics of a voltage-controlled oscillator.

A PLL circuit of the present invention includes (1) a voltage-controlled oscillator including an inductor and a capacitor and configured to output an oscillation signal having a frequency according to an input control voltage value due to a resonance phenomenon caused by the inductor and the capacitor, FV characteristics between the frequency and the control voltage value being able to be varied due to any one frequency band being selected from among a plurality of frequency bands; (2) a phase comparator configured to receive the oscillation signal output from the voltage-controlled oscillator or a signal obtained by frequency-dividing the oscillation signal as a feedback oscillation signal, receive an input signal, detect a phase difference between the feedback oscillation signal and the input signal, and output a phase difference signal indicating the phase difference; (3) a charge pump configured to receive the phase difference signal output from the phase comparator and output a charge and discharge current according to the phase difference indicated by the phase difference signal; (4) a loop filter configured to receive the charge and discharge current output from the charge pump and output the control voltage value increased or decreased according to a charge and discharge amount thereof to the voltage-controlled oscillator; (5) a frequency difference determination unit configured to receive the feedback oscillation signal and the input signal and determine whether or not a frequency difference between the feedback oscillation signal and the input signal is equal to or smaller than a threshold value; and (6) an FV characteristics adjustment unit configured to select a frequency band in the voltage-controlled oscillator on the basis of a boundary between a frequency band in which the frequency difference determination unit determines that the frequency difference is equal to or smaller than the threshold value and a frequency band in which the frequency difference determination unit determines that the frequency difference exceeds the threshold value among the plurality of frequency bands that are settable in the voltage-controlled oscillator, and adjust the FV characteristics.

Alternatively, a PLL circuit of the present invention includes (1) a voltage-controlled oscillator including a ring oscillator in which a plurality of delay elements having a delay set on the basis of an input control voltage value are connected in a ring shape, and configured to output an oscillation signal having a frequency according to an input control voltage value due to a resonance phenomenon of the ring oscillator, FV characteristics between the frequency and the control voltage value being able to be varied due to any one frequency band being selected from among a plurality of frequency bands; (2) a phase comparator configured to receive the oscillation signal output from the voltage-controlled oscillator or a signal obtained by frequency-dividing the oscillation signal as a feedback oscillation signal, receive an input signal, detect a phase difference between the feedback oscillation signal and the input signal, and output a phase difference signal indicating the phase difference; (3) a charge pump configured to receive the phase difference signal output from the phase comparator and output a charge and discharge current according to the phase difference indicated by the phase difference signal; (4) a loop filter configured to receive the charge and discharge current output from the charge pump and output the control voltage value increased or decreased according to a charge and discharge amount thereof to the voltage-controlled oscillator; (5) a frequency difference determination unit configured to receive the feedback oscillation signal and the input signal and determine whether or not a frequency difference between the feedback oscillation signal and the input signal is equal to or smaller than a threshold value; and (6) an FV characteristics adjustment unit configured to select a frequency band in the voltage-controlled oscillator on the basis of a boundary between a frequency band in which the frequency difference determination unit determines that the frequency difference is equal to or smaller than the threshold value and a frequency band in which the frequency difference determination unit determines that the frequency difference exceeds the threshold value among the plurality of frequency bands that are settable in the voltage-controlled oscillator, and adjust the FV characteristics.

It is preferable for the FV characteristics adjustment unit to select any one of the plurality of frequency bands on the basis of both the boundary on the high frequency side and the boundary on the low frequency side and adjust the FV characteristics. It is also preferable for the FV characteristics adjustment unit to select any one of the plurality of frequency bands on the basis of any one of the boundary on the high frequency side and the boundary on the low frequency side and adjust the FV characteristics.

With the PLL circuit of the present invention, it is possible to more suitably set the FV characteristics of the voltage-controlled oscillator.

DETAILED DESCRIPTION

Hereinafter, modes for carrying out the present invention will be described in detail with reference to the accompanying drawings. In description of the drawings, the same elements are denoted by the same reference numerals, and redundant description thereof will be omitted. The present invention is not limited to these illustrations, is defined by the claims, and is intended to include all changes within the meanings and scope equivalent to the claims.

Figure 1:
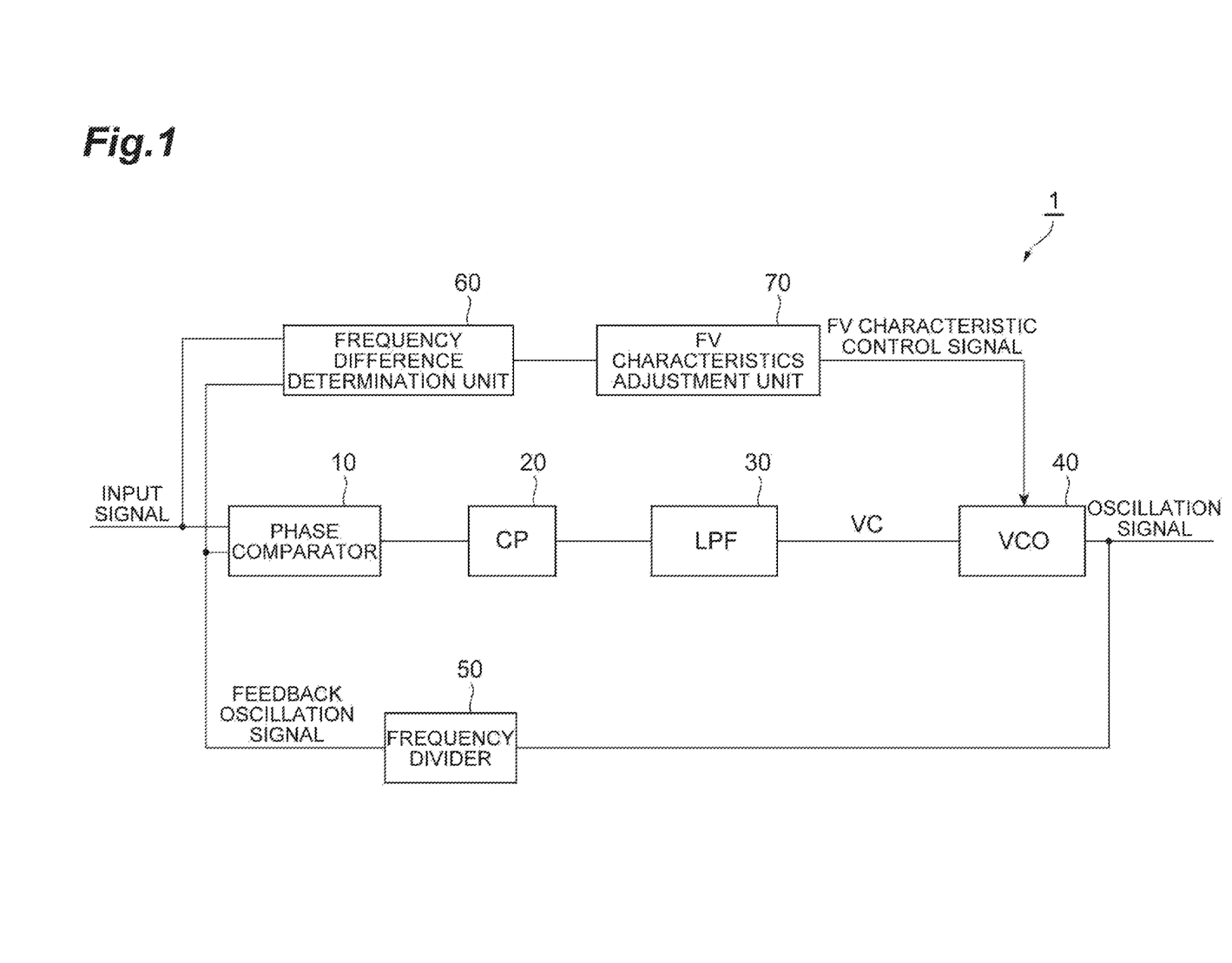
FIG. 1 is a diagram illustrating a configuration of a PLL circuit 1.

FIG. 1 is a diagram illustrating a configuration of a PLL circuit 1. The PLL circuit 1 includes a phase comparator 10, a charge pump 20, a loop filter 30, a voltage-controlled oscillator 40, a frequency divider 50, a frequency difference determination unit 60, and an FV characteristics adjustment unit 70.

The voltage-controlled oscillator 40 includes an inductor and a capacitor, and outputs an oscillation signal having a frequency according to a control voltage value input from the loop filter 30 due to a resonance phenomenon caused by the inductor and the capacitor.

The voltage-controlled oscillator 40 is an LC-VCO. In the voltage-controlled oscillator 40, FV characteristics between a frequency (F) of an output oscillation signal and a control voltage value (V) are able to be varied due to any one frequency band being selected from among a plurality of frequency bands.

The phase comparator 10 receives a signal obtained by the frequency divider 50 dividing the oscillation signal output from the voltage-controlled oscillator 40 by N as a feedback oscillation signal and also receives an input signal. The frequency divider 50 may not be provided. In this case, the oscillation signal output from the voltage-controlled oscillator 40 becomes the feedback oscillation signal that is input to the phase comparator 10. The input signal input to the phase comparator 10 may be a clock signal or may be a digital signal in which the clock signal has been embedded. The phase comparator 10 detects a phase difference between the feedback oscillation signal and the input signal, and outputs a phase difference signal indicating this phase difference to the charge pump 20.

The charge pump 20 receives the phase difference signal output from the phase comparator 10 and outputs a charge and discharge current according to the phase difference indicated by the phase difference signal.

The loop filter 30 receives the charge and discharge current output from the charge pump 20 and outputs a control voltage value VC that is increased or decreased according to a charge and discharge amount thereof to the voltage-controlled oscillator 40. The loop filter 30 includes at least a capacitor, accumulates charge in the capacitor according to the charge and discharge current output from the charge pump 20, and outputs the control voltage value VC according to the accumulated charge amount.

The frequency difference determination unit 60 receives the feedback oscillation signal and the input signal, and determines whether or not a frequency difference between the feedback oscillation signal and the input signal is equal to or smaller than a threshold value. The FV characteristics adjustment unit 70 obtains a boundary between a frequency band in which the frequency difference determination unit 60 determines that the frequency difference is equal to or smaller than the threshold value and a frequency band in which the frequency difference determination unit 60 determines that the frequency difference exceeds the threshold value among a plurality of frequency bands that can be set in the voltage-controlled oscillator 40. The FV characteristics adjustment unit 70 selects a frequency band in the voltage-controlled oscillator 40 on the basis of the obtained boundary and adjusts the FV characteristics. Details of the frequency difference determination unit 60 and the FV characteristics adjustment unit 70 will be described below.

Figure 2:
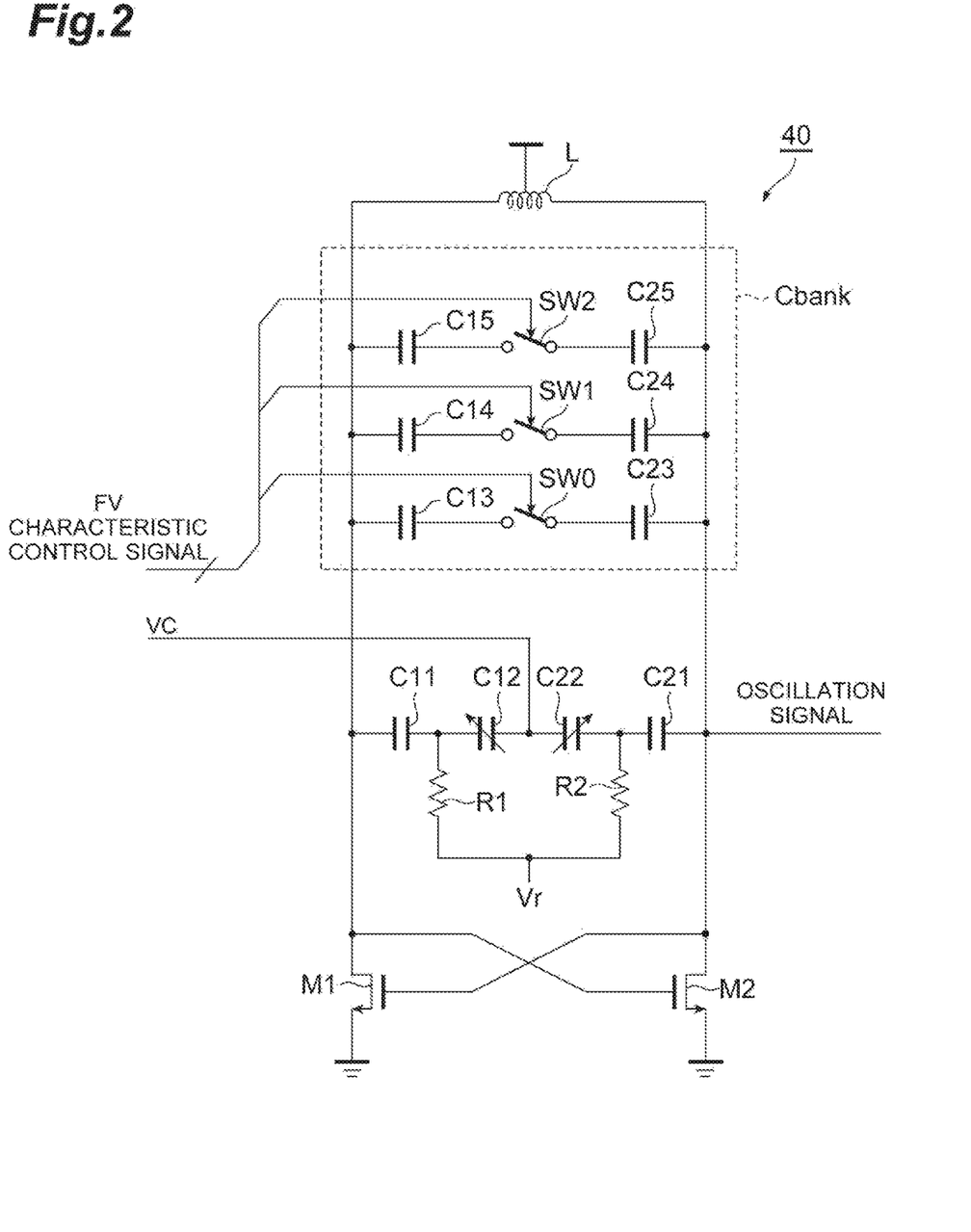
FIG. 2 is a diagram illustrating a circuit example of a voltage-controlled oscillator 40.

FIG. 2 is a diagram illustrating a circuit example of the voltage-controlled oscillator 40. In the circuit example illustrated in FIG. 2, the voltage-controlled oscillator 40 includes NMOS transistors M1 and M2, resistors R1 and R2, capacitors C11 to C15, capacitors C21 to C25, switches SW0 to SW2, and an inductor L.

Sources of the respective NMOS transistors M1 and M2 are connected to a ground potential terminal. A drain of the NMOS transistor M1 is connected to a gate of the NMOS transistor M2. A drain of the NMOS transistor M2 is connected to a gate of the NMOS transistor M1.

The capacitors C11, C12, C22, and C21 are connected in series in this order, and are provided between the drains of the NMOS transistors M1 and M2. Capacitance values of the capacitors C12 and C22 are variable. The resistors R1 and R2 connected in series are provided between a connection point between the capacitors C11 and C12 and a connection point between the capacitors C21 and C22. A voltage Vr is input to a connection point between the resistors R1 and R2.

The capacitor C13, the switch SW0, and the capacitor C23 are connected in series in this order, and are provided between the drains of the NMOS transistors M1 and M2. The capacitor C14, the switch SW1, and the capacitor C24 are connected in series in this order, and are provided between the drains of the NMOS transistors M1 and M2. The capacitor C15, the switch SW2, and the capacitor C25 are connected in series in this order, and are provided between the drains of the NMOS transistors M1 and M2.

For example, there are the following relationships between capacitance values of the capacitors C13 to C15 and the capacitors C23 to C25. C is a capacitance value of the capacitors C13 and C23.

C15=C25=2²C
C14=C24=2C
C13=C23=C

The inductor L is provided between the drains of the NMOS transistors M1 and M2. A power supply voltage VDD is applied to the inductor L.

ON/OFF of each of the three switches SW0 to SW2 is set by an FV characteristic control signal applied from the FV characteristics adjustment unit 70. The FV characteristic control signal can be indicated by 3-bit data. A total capacitance value of a capacitor bank Cbank including the capacitors C13 to C15 and the capacitors C23 to C25 is a capacitance value according to the FV characteristic control signal (that is, an ON/OFF setting state of each of the three switches SW0 to SW2). A control voltage value VC is input to a connection point between the capacitors C12 and C22. An oscillation signal is output from the drain of the NMOS transistor M2. A frequency of the output oscillation signal is an oscillation signal according to the control voltage value VC. Further, the FV characteristics are the FV characteristics according to the FV characteristic control signal.

In the configuration illustrated in FIG. 2, the number of frequency bands that can be selected in the voltage-controlled oscillator 40 is equal to the number of settable capacitance values of the capacitor bank Cbank, which is 8 (=$2^3$). By increasing the number of settable capacitance values of the capacitor bank Cbank, it is possible to increase the number of frequency bands that can be selected in the voltage-controlled oscillator 40. The voltage-controlled oscillator 40 has FV characteristics of any one selected frequency band due to the frequency band being selected from among the plurality of frequency bands.

Figure 3:
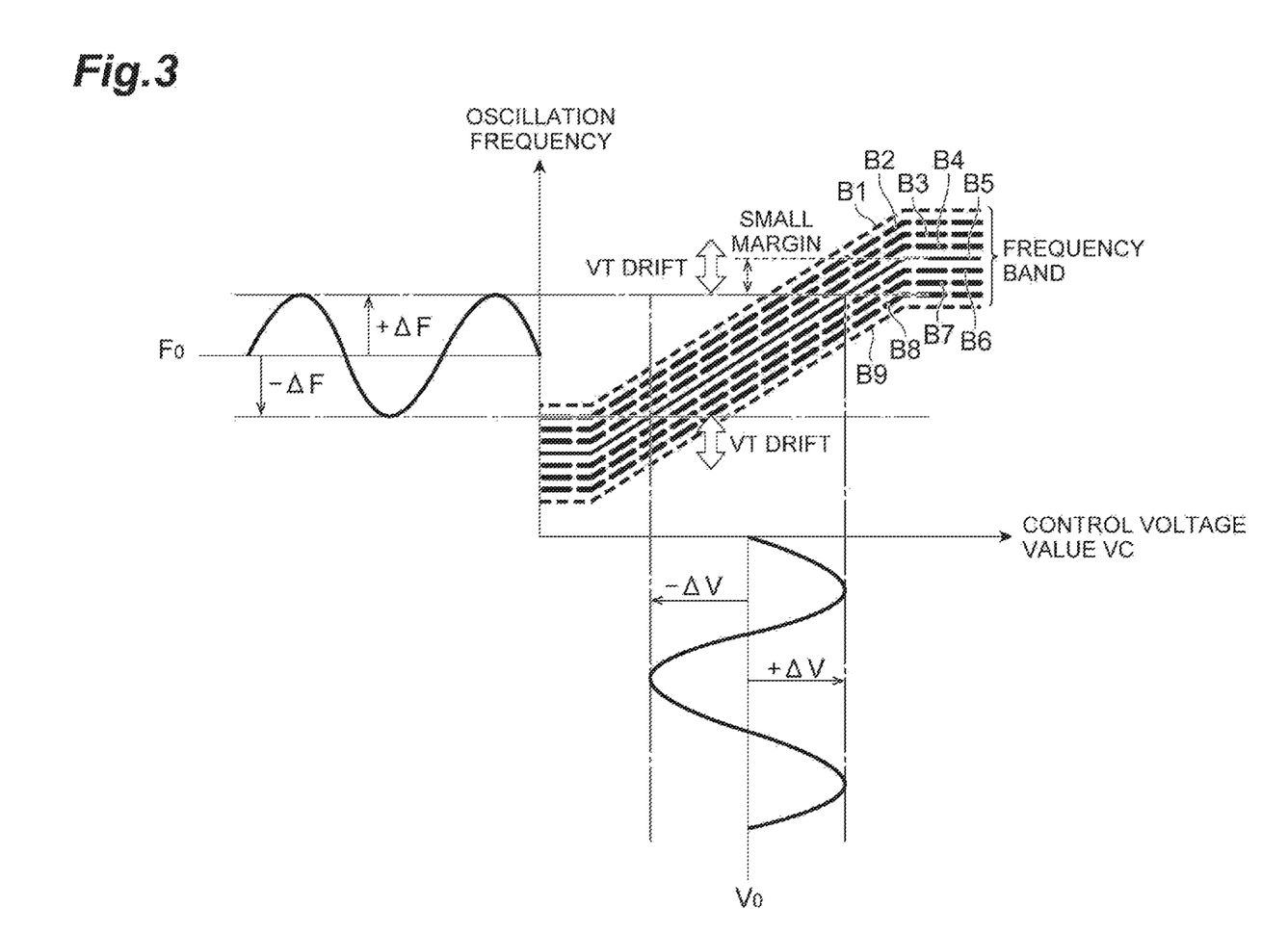
FIG. 3 is a diagram illustrating an example of FV characteristics of the voltage-controlled oscillator 40.
Figure 4A:
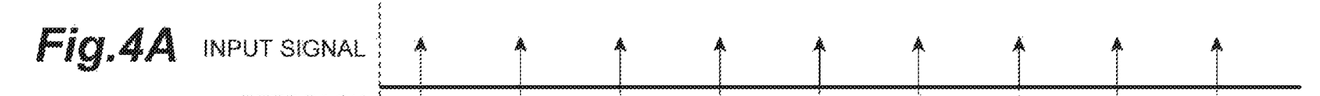
FIGS. 4A, 4B, 4C, 4D, and 4E are diagrams illustrating a cycle slip.
Figures 4B, 4C:
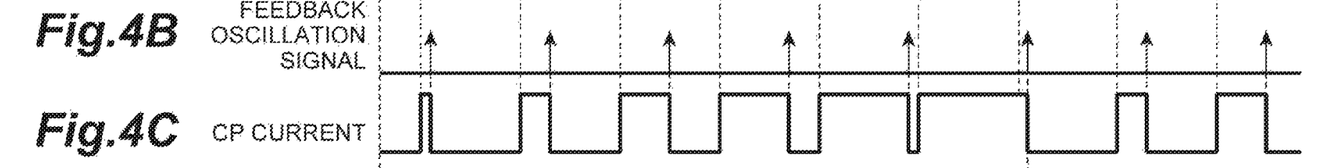
Figure 4D:
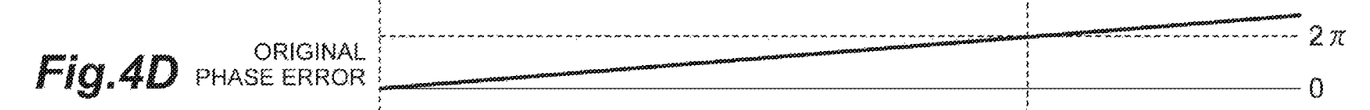
Figure 4E:
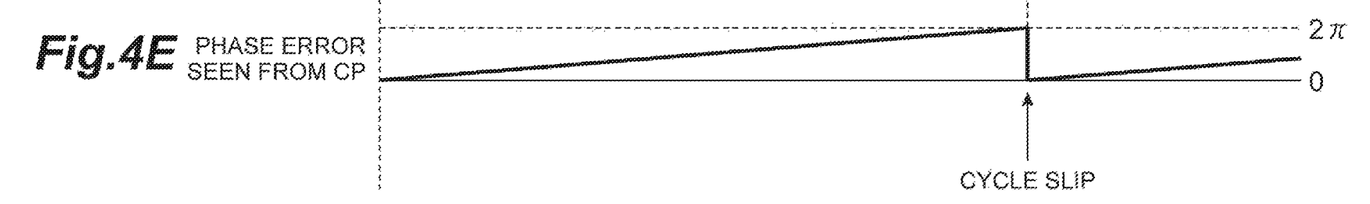

FIG. 3 is a diagram illustrating an example of the FV characteristics of the voltage-controlled oscillator 40. A horizontal axis indicates the control voltage value VC that is input to the voltage-controlled oscillator 40. A vertical axis indicates the frequency of the oscillation signal that is output from the voltage-controlled oscillator 40. In FIG. 3, the FV characteristics between the frequency of the output oscillation signal and the control voltage value VC are shown for each of nine frequency bands B1 to B9.

In FIG. 3, a median value V0 of the control voltage value VC when an SS is applied is indicated by a solid line, and a variation range (V0±ΔV) of the control voltage value VC is indicated by an alternating long and short dash line. A median value F0 of the frequency of the output oscillation signal when an SS is applied is indicated by a solid line, and a variation range (F0±ΔF) of the frequency of the output oscillation signal is indicated by an alternating long and short dash line.

The voltage-controlled oscillator 40 can select any one of a plurality of frequency bands according to the FV characteristic control signal, and output an oscillation signal having a frequency according to the input control voltage value, according to the FV characteristics of the selected frequency band. However, in any frequency band, a region in which the frequency of the output oscillation signal has a substantially linear relationship with the control voltage value is limited, and there are non-linear regions outside the linear region. It is important that the range in which the frequency varies due to the SS is in the linear region.

In the frequency bands B1 and B9 at both ends among the nine frequency bands B1 to B9 illustrated in FIG. 3, the range in which the frequency varies due to the SS includes a non-linear region. In the frequency bands B2 to B8, the range in which the frequency varies due to the SS does not include a non-linear region, and includes only a linear region. That is, the frequency bands B2 to B8 include an entire range in which the frequency of the output oscillation signal varies due to the SS. When any one of the frequency bands B2 to B8 is selected according to the FV characteristic control signal, the frequency of the output oscillation signal has a linear relationship with a frequency or bit rate of the input signal. Therefore, any one of the frequency bands B2 to B8 should be selected.

When there are a plurality of frequency bands including the entire range in which the frequency of the output oscillation signal varies due to the SS, any one of the plurality of frequency bands may be selected. However, it is preferable to select a more suitable frequency band (the frequency band B5 at a center in the example of FIG. 3) from among the plurality of frequency bands in order to secure a sufficient VT drift margin.

Therefore, the frequency difference determination unit 60 receives the feedback oscillation signal and the input signal, and determines whether or not a frequency difference between the feedback oscillation signal and the input signal is equal to or smaller than a threshold value. This is substantially equivalent to a determination as to whether or not the frequency band selected in the voltage-controlled oscillator 40 includes the entire range in which the frequency of the output oscillation signal varies due to the SS.

The FV characteristics adjustment unit 70 obtains the boundary between a frequency band in which the frequency difference determination unit 60 determines that the frequency difference is equal to or smaller than the threshold value and a frequency band in which the frequency difference determination unit 60 determines that the frequency difference exceeds the threshold value among the plurality of frequency bands that can be set in the voltage-controlled oscillator 40. This is substantially equivalent to obtaining a boundary as to whether or not the frequency band includes the entire range in which the frequency of the output oscillation signal varies due to the SS. The FV characteristics adjustment unit 70 selects a suitable frequency band in the voltage-controlled oscillator 40 on the basis of the obtained boundary and adjusts the FV characteristics.

The frequency difference determination unit 60 can determine whether or not the frequency difference between the feedback oscillation signal and the input signal is equal to or smaller than the threshold value by detecting a phenomenon (cycle slip) in which a phase error between the feedback oscillation signal and the input signal exceeds 2n.

FIGS. 4A, 4B, 4C, 4D, and 4E are diagrams illustrating the cycle slip. A horizontal axis indicates time. In FIGS. 4A, 4B, 4C, 4D, and 4E, a rising timing of the input signal (FIG. 4A), a rising timing of the feedback oscillation signal (FIG. 4B), a current applied to the charge pump (CP) (FIG. 4C), an original phase error between the feedback oscillation signal and the input signal (FIG. 4D), and a phase error as seen from the charge pump (CP) (FIG. 4E) are shown in order from the top. In the example illustrated in FIGS. 4A, 4B, 4C, 4D, and 4E, a frequency of the feedback oscillation signal is lower than a frequency of the input signal, a delay of the rising timing of the feedback oscillation signal with respect to the rising timing of the input signal gradually increases, and an amount of the current applied to the CP gradually increases. However, when the original phase error between the feedback oscillation signal and the input signal reaches 2π and a cycle slip occurs, the delay of the rising timing of the feedback oscillation signal with respect to the rising timing of the input signal temporarily decreases and then gradually increases again, and the amount of current applied to the CP temporarily decreases and then gradually increases again.

The rising timing of the input signal and the rising timing of the feedback oscillation signal should appear alternately, but when the rising timing of one of the signals appears continuously, the cycle slip occurs. The frequency difference determination unit 60 detects such a cycle slip and determines whether or not the frequency difference between the feedback oscillation signal and the input signal is equal to or smaller than the threshold value.

Figure 5:
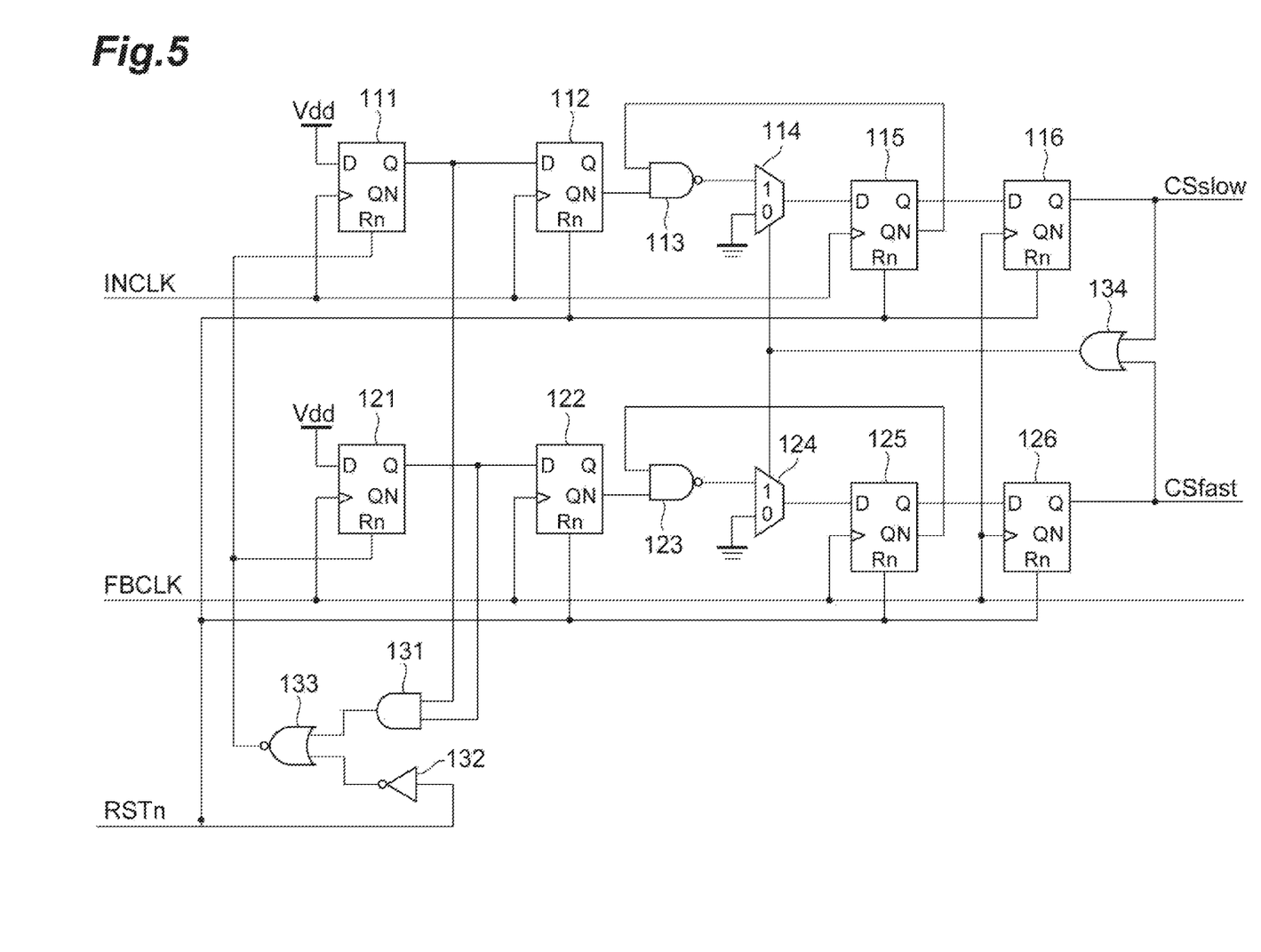
FIG. 5 is a diagram illustrating a circuit configuration example of a frequency difference determination unit 60.
Figure 6:
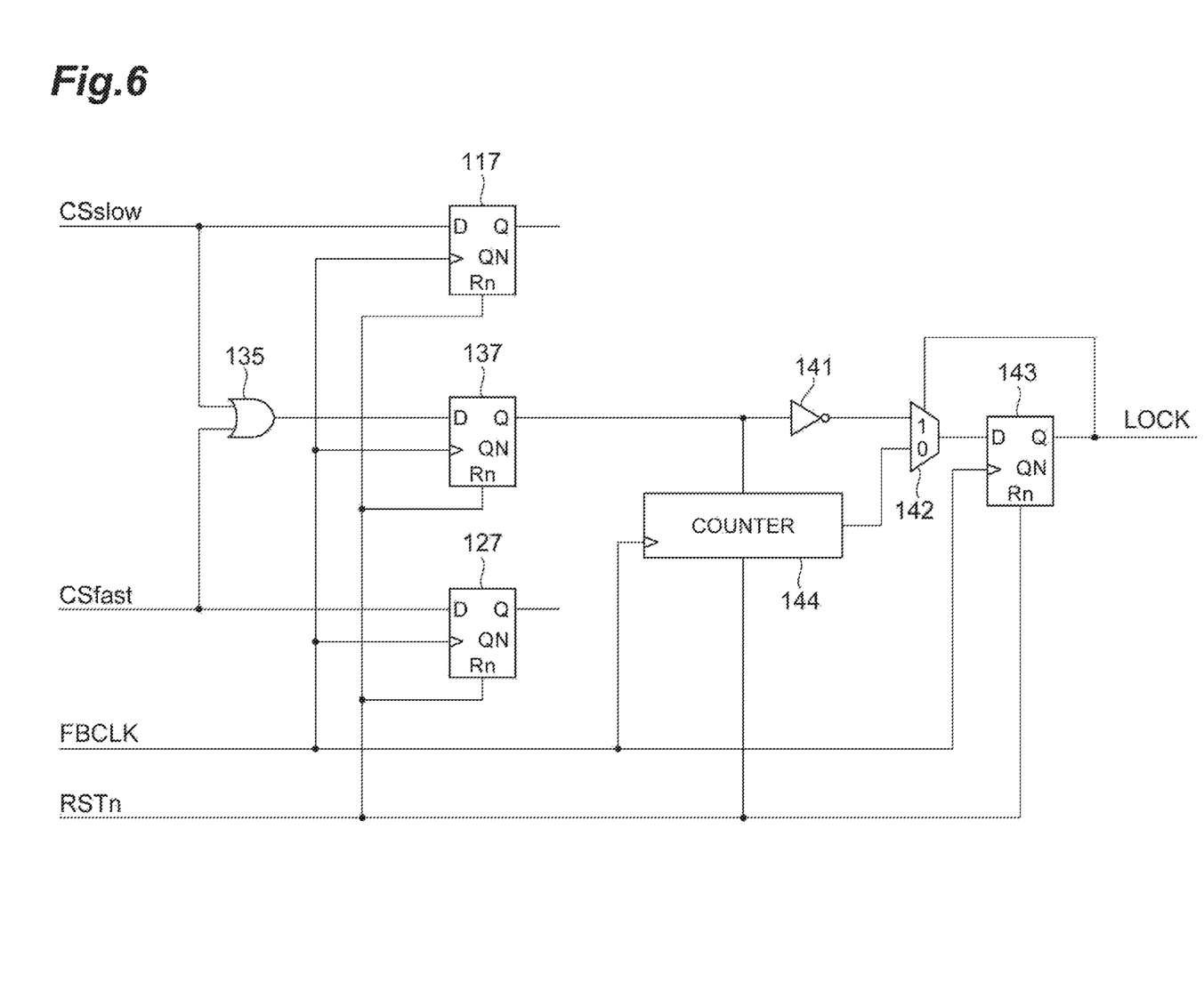
FIG. 6 is a diagram illustrating a circuit configuration example of a frequency difference determination unit 60.

FIGS. 5 and 6 are diagrams illustrating an example of a circuit configuration of the frequency difference determination unit 60. A front portion (a cycle slip detection portion) of a circuit of the frequency difference determination unit 60 is illustrated in FIG. 5, and a rear portion (a frequency difference determination portion) is illustrated in FIG. 6.

An Rn input terminal of a D flip-flop 111 is connected to an output terminal of a NOR gate 133. An H level signal is input to a D input terminal of the D flip-flop 111. The D flip-flop 111 performs a latch operation at a rising timing of an input signal INCLK.

A reset instruction signal RSTn is input to an Rn input terminal of the D flip-flop 112. A D input terminal of the D flip-flop 112 is connected to a Q output terminal of the D flip-flop 111. The D flip-flop 112 performs a latch operation at the rising timing of the input signal INCLK.

One input terminal of a NAND gate 113 is connected to a QN output terminal of the D flip-flop 112. The other input terminal of the NAND gate 113 is connected to a QN output terminal of a D flip-flop 115.

One input terminal of a selector 114 is connected to an output terminal of the NAND gate 113. An L level signal is input to the other input terminal of the selector 114. The selector 114 outputs, from an output terminal, a signal having the same level as a signal input to one of the two input terminals according to a logic level of a signal output from an output terminal of an OR gate 134.

The reset instruction signal RSTn is input to an Rn input terminal of the D flip-flop 115. A D input terminal of the D flip-flop 115 is connected to an output terminal of the selector 114. The D flip-flop 115 performs a latch operation at the rising timing of the input signal INCLK.

The reset instruction signal RSTn is input to an Rn input terminal of the D flip-flop 116. A D input terminal of the D flip-flop 116 is connected to a Q output terminal of the D flip-flop 115. The D flip-flop 116 performs a latch operation at the rising timing of the feedback oscillation signal FBCLK.

An Rn input terminal of the D flip-flop 121 is connected to the output terminal of the NOR gate 133. An H level signal is input to a D input terminal of the D flip-flop 121. The D flip-flop 121 performs a latch operation at the rising timing of the feedback oscillation signal FBCLK.

The reset instruction signal RSTn is input to an Rn input terminal of a D flip-flop 122. A D input terminal of the D flip-flop 122 is connected to a Q output terminal of the D flip-flop 121. The D flip-flop 122 performs a latch operation at the rising timing of the feedback oscillation signal FBCLK.

One input terminal of a NAND gate 123 is connected to a QN output terminal of the D flip-flop 122. The other input terminal of the NAND gate 123 is connected to a QN output terminal of a D flip-flop 125.

One input terminal of a selector 124 is connected to an output terminal of the NAND gate 123. An L level signal is input to the other input terminal of the selector 124. The selector 124 outputs, from an output terminal, a signal having the same level as a signal input to one of the two input terminals according to a logic level of a signal output from the output terminal of the OR gate 134.

The reset instruction signal RSTn is input to an Rn input terminal of the D flip-flop 125. A D input terminal of the D flip-flop 125 is connected to an output terminal of the selector 124. The D flip-flop 125 performs a latch operation at the rising timing of the feedback oscillation signal FBCLK.

The reset instruction signal RSTn is input to an Rn input terminal of the D flip-flop 126. A D input terminal of the D flip-flop 126 is connected to a Q output terminal of the D flip-flop 125. The D flip-flop 126 performs a latch operation at the rising timing of the feedback oscillation signal FBCLK.

One input terminal of an AND gate 131 is connected to the Q output of the D flip-flop 111. The other input terminal of the AND gate 131 is connected to the Q output of the D flip-flop 121. An INV gate 132 outputs a signal obtained by logically inverting the reset instruction signal RSTn. One input terminal of the NOR gate 133 is connected to an output terminal of the AND gate 131. The other input terminal of the NOR gate 133 is connected to an output terminal of the INV gate 132.

One input terminal of the OR gate 134 is connected to a Q output terminal of the D flip-flop 116. The other input terminal of the OR gate 134 is connected to a Q output terminal of the D flip-flop 126.

One input terminal of an OR gate 135 is connected to the Q output terminal of the D flip-flop 116. The other input terminal of the OR gate 135 is connected to the Q output terminal of the D flip-flop 126.

The reset instruction signal RSTn is input to an Rn input terminal of a D flip-flop 117. A D input terminal of the D flip-flop 117 is connected to a Q output terminal of the D flip-flop 116. The D flip-flop 117 performs a latch operation at the rising timing of the feedback oscillation signal FBCLK.

The reset instruction signal RSTn is input to an Rn input terminal of a D flip-flop 127. A D input terminal of the D flip-flop 127 is connected to a Q output terminal of the D flip-flop 126. The D flip-flop 127 performs a latch operation at the rising timing of the feedback oscillation signal FBCLK.

The reset instruction signal RSTn is input to an Rn input terminal of a D flip-flop 137. A D input terminal of the D flip-flop 137 is connected to an output terminal of the OR gate 135. The D flip-flop 137 performs a latch operation at the rising timing of the feedback oscillation signal FBCLK.

An INV gate 141 outputs a signal obtained by logically inverting a signal output from a Q output terminal of the D flip-flop 137. One input terminal of a selector 142 is connected to an output terminal of the INV gate 141. The other input terminal of the selector 142 is connected to an output terminal of a counter 144. The selector 142 outputs, from an output terminal, a signal having the same level as a signal input to one of two input terminals according to a logic level of the signal output from the Q output terminal of a D flip-flop 143.

The reset instruction signal RSTn is input to an Rn input terminal of the D flip-flop 143. A D input terminal of the D flip-flop 143 is connected to an output terminal of the selector 142. The D flip-flop 143 performs a latch operation at the rising timing of the feedback oscillation signal FBCLK.

The counter 144 performs a count-up operation at the rising timing of the feedback oscillation signal FBCLK. The count-up operation of the counter 144 is initialized by the reset instruction signal RSTn, and is also initialized when the signal output from the Q output terminal of the D flip-flop 137 reaches an H level. The counter 144 outputs an L level signal until a count value reaches a certain threshold value, and outputs an H level signal after the count value reaches the threshold value.

An operation of the frequency difference determination unit 60 having such a circuit configuration is as follows. At the start of the operation, all the D flip-flops and the counter 144 are initialized by the reset instruction signal RSTn. In an initialized state, the signals output from the Q output terminals of all the D flip-flops are at an L level, the signals output from the QN output terminals of all the D flip-flops are at an H level, and the count value of the counter 144 is 0.

When the signals output from the Q output terminals of the D flip-flops 111 and 121 both reach the H level, an output signal of the AND gate 131 reaches the H level and an output signal of the NOR gate 133 reaches the L level, and thus, both of the D flip-flops 111 and 121 are initialized.

A signal output from the Q output terminal of the D flip-flop 111 is latched by the D flip-flop 112 at the rising timing of the input signal INCLK. A signal output from the Q output terminal of the D flip-flop 121 is latched by the D flip-flop 122 at the rising timing of the feedback oscillation signal FBCLK.

When the rising timing of the input signal INCLK and the rising timing of the feedback oscillation signal FBCLK appear alternately, the signals output from the Q output terminals of the respective D flip-flops 111 and 121 are at the L level, and the signals output from the QN output terminals of the respective D flip-flop 112 and 122 are at the HI level. Further, signals output from the output terminals of the respective NAND gates 113 and 123 are at L level, signals output from the output terminals of the selectors 114 and 124 are at L level, and signals output from the QN output terminals of the respective D flip-flops 115 and 125 are at the H level.

When the rising timing of the input signal INCLK continuously appears without the rising timing of the feedback oscillation signal FBCLK appearing after the rising timing of the input signal INCLK (that is, when the feedback oscillation signal FBCLK is late), the signal output from the Q output terminal of the D flip-flop 11 is at the H level. Accordingly, the signal output from the QN output terminal of the D flip-flop 112 is at the L level. The signal output from the output terminal of the NAND gate 113 reaches the H level, the signal output from the output terminal of the selector 114 reaches the H level, the signal output from the QN output terminal of the D flip-flop 115 reaches the L level, and the signal output from the Q output terminal of the D flip-flop 115 reaches the H level. At a subsequent rising timing of the feedback oscillation signal FBCLK, a signal CSslow output from the Q output terminal of the D flip-flop 116 reaches the H level. This signal CSslow reaching the H level indicates that the cycle slip has occurred due to the late feedback oscillation signal FBCLK.

On the other hand, when the rising timing of the feedback oscillation signal FBCLK continuously appears without the rising timing of the input signal INCLK appearing after the rising timing of the feedback oscillation signal FBCLK (that is, when the feedback oscillation signal FBCLK is early), the signal output from the Q output terminal of the D flip-flop 121 is at the H level. Accordingly, the signal output from the QN output terminal of the D flip-flop 122 is at the L level. The signal output from the output terminal of the NAND gate 123 reaches the H level, the signal output from the output terminal of the selector 124 reaches the H level, the signal output from the QN output terminal of the D flip-flop 125 reaches the L level, and the signal output from the Q output terminal of the D flip-flop 125 reaches the H level. At a subsequent rising timing of the feedback oscillation signal FBCLK, a signal CSfast output from the Q output terminal of the D flip-flop 126 reaches the H level. This signal CSfast reaching the H level indicates that the cycle slip has occurred due to the early feedback oscillation signal FBCLK.

When the signal CSslow or the signal CSfast reaches the H level, the signal output from the OR gate 134 reaches the H level and input selection in the selectors 114 and 124 changes. Accordingly, both the signal CSslow and the signal CSfast are at the L level. A period in which the signal CSslow or the signal CSfast is at the H level corresponds to two cycles of the feedback oscillation signal FBCLK.

When the signal CSslow reaches the H level, the signal output from the Q output terminal of the D flip-flop 117 reaches the H level at the subsequent rising timing of the feedback oscillation signal FBCLK. The signal output from the Q output terminal of the D flip-flop 117 being at the H level indicates that the cycle slip has occurred due to the late feedback oscillation signal FBCLK.

When the signal CSfast reaches the H level, a signal output from the Q output terminal of the D flip-flop 127 reaches the H level at a subsequent rising timing of the feedback oscillation signal FBCLK. The signal output from the Q output terminal of the D flip-flop 127 being at the H level indicates that the cycle slip has occurred due to the early feedback oscillation signal FBCLK.

When the signal CSslow or the signal CSfast reaches the H level, a signal output from the OR gate 135 reaches the H level, and the signal output from the Q output terminal of the D flip-flop 137 at a subsequent rising timing of the feedback oscillation signal FBCLK reaches the H level. The signal output from the Q output terminal of the D flip-flop 137 reaching the H level indicates that the cycle slip has occurred regardless of whether the feedback oscillation signal FBCLK is early or late. A period in which the signal output from the Q output terminal of the D flip-flop 137 is at the H level corresponds to two cycles of the feedback oscillation signal FBCLK.

When the signal output from the Q output terminal of the D flip-flop 137 reaches the H level, the counter 144 is initialized, and the count value of the counter 144 becomes zero. In this case, since the count value of the counter 144 has not reached the threshold value, the signal output from the counter 144 is at an L level, and a signal LOCK output from the Q output terminal of the D flip-flop 143 is at an L level. The signal output from the selector 142 in a period in which the signal LOCK is at the L level is a signal output from the counter 144.

The counter 144 performs a count-up operation at the rising timing of the feedback oscillation signal FBCLK. When the signal output from the Q output terminal of the D flip-flop 137 reaches the H level again before the count value of the counter 144 reaches the threshold value, the counter 144 is initialized again. Accordingly, in this case, a state in which the signal LOCK is at the L level continues.

When the count value of the counter 144 reaches a threshold value before the signal output from the Q output terminal of the D flip-flop 137 reaches the H level again, the signal output from the counter 144 changes to an H level, and the signal LOCK changes to an H level. The signal output from the selector 142 in a period in which the signal LOCK is at the H level is a signal obtained by the signal output from the Q output terminal of the D flip-flop 137 being logically inverted by the INV gate 141.

Thus, the frequency difference determination unit 60 can determine whether or not a frequency difference between the feedback oscillation signal FBCLK and the input signal INCLK is equal to or smaller than a threshold value according to whether or not the signal LOCK reaches the H level. The threshold value in the counter 144 corresponds to the threshold value regarding the frequency difference. Changing the threshold value in the counter 144 corresponds to changing a length of a period in which the cycle slip does not occur, which is a reference when it is determined that the feedback oscillation signal FBCLK and the input signal INCLK are in a locked state. The period in which the cycle slip does not occur being 10 times a cycle of the feedback oscillation signal FBCLK corresponds to the frequency difference between the feedback oscillation signal FBCLK and the input signal INCLK being smaller than 10%.

The FV characteristics adjustment unit 70 obtains a boundary as to whether or not the frequency difference between the feedback oscillation signal and the input signal is the threshold value on the basis of a result of the determination of the frequency difference determination unit 60, and selects a suitable frequency band in the voltage-controlled oscillator 40 from a plurality of frequency bands that can be set in the voltage-controlled oscillator 40. There are various aspects of a way of obtaining the boundary and a method of selecting the suitable frequency band. Hereinafter, the way for obtaining the boundary and the method of selecting the suitable frequency band will be described in an example in which there are the nine frequency bands B1 to B9 illustrated in FIG. 3.

A first method of obtaining the boundary is a method in which the frequency difference determination unit 60 determines whether or not the frequency difference between the feedback oscillation signal and the input signal is equal to or smaller than the threshold value in an order from one side of a plurality of frequency bands arranged from a high frequency side to a low frequency side, such that the boundary is obtained. In the example in which there are the nine frequency bands B1 to B9 illustrated in FIG. 3, the frequency difference determination unit 60 first determines that the frequency difference exceeds the threshold value for the frequency band B1, determines that the frequency difference is equal to or smaller than the threshold value for the frequency band B2, determines that the frequency difference is equal to or smaller than the threshold value for the frequency bands B3 to B8, and lastly determines that the frequency difference exceeds the threshold value for the frequency band B9. From a result of these determinations, it can be seen that the frequency bands B2 and B8 are at the boundary.

A second method of obtaining the boundary is a method in which the frequency difference determination unit 60 determines whether or not the frequency difference is equal to or smaller than the threshold value in an order from one side of a plurality of frequency bands arranged from a high frequency side to a low frequency side, and the frequency difference determination unit 60 determines whether or not the frequency difference is equal to or smaller than the threshold value in an order from the other side, such that the boundary is obtained. In the example in which there are the nine frequency bands B to B9 illustrated in FIG. 3, the frequency difference determination unit 60 determines that the frequency difference exceeds the threshold value for the frequency band B1, and then, determines that the frequency difference is equal to or smaller than the threshold value for the frequency band B2. Then, the frequency difference determination unit 60 determines that the frequency difference exceeds the threshold value for the frequency band B9, and then, determines that the frequency difference is equal to or smaller than the threshold value for the frequency band B8. From a result of these determinations, it can be seen that the frequency bands B2 and B8 are at the boundary.

A third method of obtaining the boundary is a method in which the frequency difference determination unit 60 determines whether or not the frequency difference is equal to or smaller than the threshold value in an order from one side of a plurality of frequency bands arranged from a high frequency side to a low frequency side, such that one boundary is obtained, and then, the frequency difference determination unit 60 determines whether or not the frequency difference is equal to or smaller than the threshold value before and after the frequency band that is present a predetermined number of frequency bands ahead of the frequency band present at the boundary, such that the other boundary is obtained. In the example in which there are the nine frequency bands B1 to B9 illustrated in FIG. 3, the frequency difference determination unit 60 determines that the frequency difference exceeds the threshold value for the frequency band B1, and then, determines that the frequency difference is equal to or smaller than the threshold value for the frequency band B2. Accordingly, it can be seen that the frequency band B2 is at the one boundary. Then, the frequency difference determination unit 60 determines whether the frequency difference is equal to or smaller than the threshold value before and after the frequency band B7 that is present, for example, five frequency band ahead of the frequency band B2. That is, the frequency difference determination unit 60 determines that the frequency difference is equal to or smaller than the threshold value for the frequency band B7, determines that the frequency difference is equal to or smaller than the threshold value for the previous frequency band B8, and lastly determines that the frequency difference exceeds the threshold value for the frequency band B9. Accordingly, it can be seen that the frequency band B8 are at the other boundary. When the frequency difference determination unit 60 determines that the frequency difference exceeds the threshold value for the frequency band B7, the frequency difference determination unit 60 determines whether the frequency difference is equal to or smaller than the threshold value in an order of the previous frequency bands B6, B5, . . . .

A first method of selecting the suitable frequency band is a method in which any suitable frequency band is selected from a plurality of frequency bands on the basis of both of two boundaries (a boundary on the high frequency side and a boundary on the low frequency side). In the example in which there are the nine frequency bands B1 to B9 illustrated in FIG. 3, a frequency band sufficiently separated from any one of the one boundary (the frequency band B2) and the other boundary (the frequency band B8) such that the VT drift margin can be secured sufficiently is selected. Preferably, the frequency band B5 at a center between the two boundaries is selected.

A second method of selecting the suitable frequency band is a method in which any suitable frequency band is selected from a plurality of frequency bands on the basis of any one of two boundaries (a boundary on the high frequency side and a boundary on the low frequency side). In the example in which there are the nine frequency bands B1 to B9 illustrated in FIG. 3, a frequency band sufficiently separated from any one of the one boundary (the frequency band B2) and the other boundary (the frequency band B8) such that the VT drift margin can be secured sufficiently is selected. In the first to third methods of obtaining the boundary, the two boundaries (B2, B8) are obtained, whereas when such a method is combined with the second method of selecting the suitable frequency band, only any one of the boundaries may be obtained.

As described above, the PLL circuit 1 of the embodiment can set the FV characteristics of the voltage-controlled oscillator 40 more suitably.

The case in which the LC-VCO is used as the voltage-controlled oscillator has been described above. However, the present invention can also be applied to a case in which a voltage-controlled oscillator including a ring oscillator in which a plurality of delay elements having a delay set on the basis of the input control voltage value VC are connected in a ring shape is used in the PLL circuit 1 illustrated in FIG. 1. This voltage-controlled oscillator outputs an oscillation signal having a frequency according to the control voltage value VC due to an oscillation phenomenon of the ring oscillator. In the voltage-controlled oscillator, FV characteristics between the frequency (F) and the control voltage value are able to be varied due to any one frequency band being selected from among a plurality of frequency bands.

Generally, in the voltage-controlled oscillator including the ring oscillator, a slope of FV characteristics is large and it is easy to secure a sufficient VT drift margin, as compared with the LC-VCO as described above. On the other hand, in the voltage-controlled oscillator including the ring oscillator, a jitter in a high-speed operation tends to be larger. This voltage-controlled oscillator is suitable since a large SS can be applied in a system of about several Gbps in which a large jitter is allowed.

Figure 7:
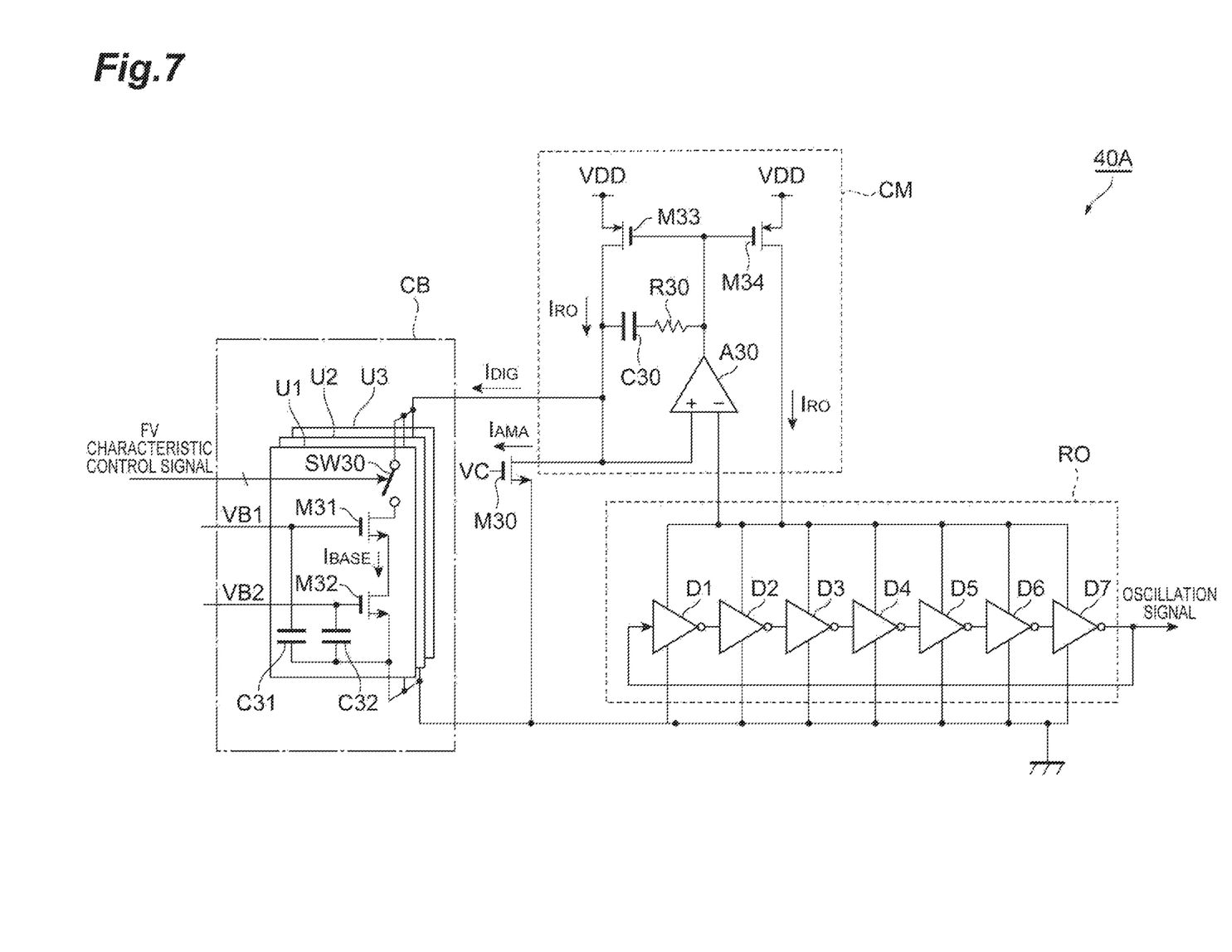
FIG. 7 is a diagram illustrating a circuit example of a voltage-controlled oscillator 40A.

FIG. 7 is a diagram illustrating a circuit example of a voltage-controlled oscillator 40A. The voltage-controlled oscillator 40A can be used in place of the voltage-controlled oscillator 40 in the PLL circuit 1 illustrated in FIG. 1. In the circuit example illustrated in FIG. 7, the voltage-controlled oscillator 40A includes a ring oscillator RO, a current mirror circuit CM, a current bank circuit CB, and an NMOS transistor M30 as a control switch.

The ring oscillator RO has a configuration in which a plurality (seven in FIG. 7) of delay elements D1 to D7 are connected in a ring shape. The delay elements D1 to D7 may be inverter circuits or may be differential buffers. A delay of each of the delay elements D1 to D7 is set by a driving current $I_{RO}$ that is applied from the current mirror circuit CM.

The current mirror circuit CM includes a PMOS transistor M33, a PMOS transistor M34, an amplifier A30, a capacitor C30, and a resistor R30. A power supply voltage VDD is input to sources of the respective PMOS transistors M33 and M34. A drain of the PMOS transistor M33 is connected to a non-inverting input terminal of the amplifier A30. A drain of the PMOS transistor M34 is connected to an inverting input terminal of the amplifier A30, and applies a driving current to each of the delay elements D1 to D7 of the ring oscillator RO. An output terminal of the amplifier A30 is connected to gates of the PMOS transistors M33 and M34, and is connected to the drain of the PMOS transistor M33 via the capacitor C30 and the resistor R30.

The current bank circuit CB includes a plurality (three in FIG. 7) of units U1 to U3 provided in parallel with each other. Each unit includes a switch SW30, an NMOS transistor M31, an NMOS transistor M32, a capacitor C31, and a capacitor C32. A drain of the NMOS transistor M31 is connected to the drain of the PMOS transistor M33 via the switch SW30. A source of the NMOS transistor M31 is connected to a drain of the NMOS transistor M32. A source of the NMOS transistor M32 is set to a ground potential. One terminal of the capacitor C31 is connected to a gate of the NMOS transistor M31, and the other terminal of the capacitor C31 is set to the ground potential. One terminal of the capacitor C32 is connected to a gate of the NMOS transistor M32, and the other terminal of the capacitor C32 is set to the ground potential. A bias voltage VB1 is input to the gate of the NMOS transistor M31. A bias voltage VB2 is input to the gate of the NMOS transistor M32. In the switch SW30 of each unit U1, an ON/OFF state is set according to a value of the FV characteristic control signal.

A drain of the NMOS transistor M30 as a control switch is connected to the drain of the PMOS transistor M33. A source of the NMOS transistor M30 is set to the ground potential. The control voltage value VC is input to a gate of the NMOS transistor M30.

In the voltage-controlled oscillator 40A, the amount $I_{DIG}$ of current flowing through the current bank circuit CB is set when ON/OFF the 3-bit switch SW30 of the current bank circuit CB is set by the FV characteristic control signal. By the current amount $I_{DIG}$ being set, an amount $I_{RO}$ of current flowing through each of the PMOS transistors M33 and M34 of the current mirror circuit CM is set, and an amount $I_{RO}$ of driving current applied from the drain of the PMOS transistor M34 to each of the delay elements D1 to D7 of the ring oscillator RO is set. Accordingly, the frequency band is selected.

Further, in the voltage-controlled oscillator 40A, the amount $I_{ANA}$ of current flowing through the NMOS transistor M30 is adjusted according to the control voltage value VC applied to the gate of the NMOS transistor M30, which is a control switch. Through the adjustment of the current amount LANA, the amount $I_{RO}$ of driving current applied to each of the delay elements D1 to D7 of the ring oscillator RO is adjusted. Accordingly, the amount is adjusted with an oscillation frequency according to the control voltage value VC.

The PLL circuit of the embodiment can be applied to a video transmission interface that transmits a video signal having a high definition, such as a display interface that is used in a display device such as a television receiver and a monitor device, and a camera interface that is used in an imaging device such as a camera and a video device. In general, in an electronic device using the video transmission interface as described above, a surface is not covered with a metal in order to reduce a weight of the electronic device, and on the other hand, a board or a cable cannot be firmly electromagnetically shielded in order to reduce a total cost. Therefore, an SS clock signal having a relatively higher modulation intensity (±1% or more) than that of other communication interfaces is required in order to reduce an influence of electromagnetic waves on human bodies or surrounding electronic devices. Since the FV characteristics of the PLL circuit and the voltage-controlled oscillator of the embodiment can be set more suitably, it is possible to generate the SS clock signal having a relatively higher modulation intensity (±1% or more) than that of other communication interfaces in order to reduce the influence of the electromagnetic waves on human bodies or surrounding electronic devices even when the PLL circuit is applied to the video transmission interface as described above.

As described above, the PLL circuit illustrated in FIG. 1 includes the phase comparator 10 having a first input terminal and a second input terminal for input signals, the charge pump 20 having an input terminal connected to the output terminal of the phase comparator 10, the loop filter 30 (a low-pass filter) having an input terminal connected to an output terminal of the charge pump 20, the voltage-controlled oscillator 40 having an input terminal connected to an output terminal of the loop filter 30, a capacitor group for resonance (a capacitor group (Cbank) and the capacitors C11, C12, C21, and C22 in FIG. 2), and a control terminal (a terminal to which a signal from the FV characteristics adjustment unit 70 is input) of a capacitance value of the capacitor group, the frequency divider 50 having an input terminal connected to an output terminal of the voltage-controlled oscillator 40, and an output terminal connected to the second input terminal, a frequency difference detector (the frequency difference determination unit 60) having a first input terminal and a second input terminal respectively connected to the first input terminal and the second input terminal of the phase comparator 10, and a capacitance adjuster (the FV characteristics adjustment unit 70) having an input terminal connected to an output terminal of the frequency difference detector, and an output terminal connected to the control terminal for a capacitance value of the voltage-controlled oscillator 40.

The frequency difference determination unit 60 (FIG. 5) is a frequency difference detector and includes a phase difference detector. To be precise, the flip-flop 137 (an edge detector) that detects a slip edge is connected to an output terminal of the frequency difference detector, and the counter 144 is connected to an output terminal of the flip-flop 137. The capacitance adjuster outputs a multi-bit (3 bits in the above example) digital signal for controlling ON and OFF of a capacitance adjustment switch according to the above-described algorithm, in accordance with an output of the counter 144. The capacitance adjuster can include, for example, an 8-bit microcomputer (a logic circuit) including a memory in which the above-described algorithm has been stored.

The voltage-controlled oscillator 40 illustrated in FIG. 2 is an LC-VCO and therefore includes an LC tank circuit. That is, the inductor L and the capacitor group in FIG. 2 resonate to constitute an LC resonator (an LC tank circuit). A capacitance value (a combined capacitance value) C of the capacitor contributing to the resonance in the voltage-controlled oscillator 40 determines a resonance frequency together with an inductance value L of the inductor L. In a general LC circuit, since a resonance frequency $f=1/(2\pi(LC)^{0.5})$, a resonance frequency of an output signal (an oscillation signal) of a VCO can be controlled when a combined capacitance value C is controlled through control of the switches SW0, SW1, and SW2.

The voltage-controlled oscillator 40A (40) illustrated in FIG. 7 includes the ring oscillator RO, and a resonance frequency of the ring oscillator RO depends on a capacitance value (a combined capacitance value) of a capacitor contributing to resonance in the current bank circuit CB. When the switch SW30 is controlled so that a combined capacitance value C in the current bank circuit CB is controlled, a resonance frequency of an output signal (an oscillation signal) of the VCO can be controlled.

DESCRIPTION OF REFERENCE SIGNS

1: PLL circuit, 10: Phase comparator, 20: Charge pump, 30: Loop filter, 31: Resistor, 32: Capacitor, 33: Capacitor, 34: Buffer, 40, 40A: Voltage controlled oscillator, 50: Frequency divider, 60: Frequency difference determination unit (phase difference detector), 70: FV characteristics adjustment unit (Capacitance Adjuster).

What is claimed is:
1. A PLL circuit comprising:
   a phase comparator having a first input terminal and a second input terminal for input signals;
   a charge pump having an input terminal connected to an output terminal of the phase comparator;
   a loop filter having an input terminal connected to an output terminal of the charge pump;
   a voltage-controlled oscillator having an input terminal connected to an output terminal of the loop filter, a capacitor group for resonance, and a control terminal of a capacitance value of the capacitor group;
   a frequency divider having an input terminal connected to an output terminal of the voltage-controlled oscillator, and an output terminal connected to the second input terminal;
   a frequency difference detector having a first input terminal and a second input terminal respectively connected to the first input terminal and the second input terminal of the phase comparator; and
   a capacitance adjuster having an input terminal connected to an output terminal of the frequency difference detector, and an output terminal connected to the control terminal for the capacitance value of the voltage-controlled oscillator, wherein the capacitance adjuster adjusts the capacitance value of the voltage-controlled oscillator so that a frequency of an oscillation signal output from the voltage-controlled oscillator has a linear relationship with a frequency or a bit rate of a signal input to the PLL circuit.
2. The PLL circuit according to claim 1, wherein the voltage-controlled oscillator includes an LC tank circuit.

* * * * *